(12) United States Patent
Morikawa et al.

(10) Patent No.: US 6,314,015 B1
(45) Date of Patent: Nov. 6, 2001

(54) SEMICONDUCTOR MEMORY DEVICE FOR READING INFORMATION IN MEMORY CELLS

(75) Inventors: Yoshinao Morikawa, Nara; Jyunichi Tanimoto, Ikoma, both of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/501,710

(22) Filed: Feb. 10, 2000

(30) Foreign Application Priority Data

Mar. 30, 1999 (JP) .................................................. 11-090275

(51) Int. Cl.[7] .................................................. G11C 17/00
(52) U.S. Cl. ............................................. 365/104; 365/204
(58) Field of Search ................................... 365/104, 103, 365/94, 204, 189.01

(56) References Cited

U.S. PATENT DOCUMENTS

| 5,448,518 | * | 9/1995 | Jinbo | 365/185.06 |
| 5,583,808 | * | 12/1996 | Brahmbhatt | 365/185.05 |
| 5,625,586 | * | 4/1997 | Yamasaki et al. | 365/104 |
| 5,875,128 | * | 2/1999 | Ishizuka | 365/185.06 |

FOREIGN PATENT DOCUMENTS 10011991    1/1998   (JP) .

* cited by examiner

Primary Examiner—Hoai V. Ho
(74) Attorney, Agent, or Firm—Morrison & Foerster LLP

(57) ABSTRACT

A semiconductor memory device includes a plurality of bit lines; a plurality of virtual GND lines; and a plurality of memory cell transistors arranged in an array. The plurality of bit lines includes a selected bit line directly connected to a memory cell transistor to be read among the plurality of memory cell transistors and a non-selected bit line. The plurality of virtual GND lines includes a selected virtual GND line directly connected to the memory cell transistor to be read and a non-selected virtual GND line. The non-selected bit lines include a charge non-selected bit line to be charged and a non-selected dummy bit line to be grounded. The non-selected virtual GND lines include a charge non-selected virtual GND line to be charged. The non-selected dummy bit line is connected between the selected virtual GND line and one of the charge non-selected bit line and the charge non-selected virtual GND line.

14 Claims, 9 Drawing Sheets

US 6,314,015 B1

SEMICONDUCTOR MEMORY DEVICE FOR READING INFORMATION IN MEMORY CELLS

BACKGROUND OF THE INVENTION

1. Field of the Invention

The present invention relates to a semiconductor memory device, and specifically to a memory array for reading information in memory cells using bit lines and virtual GND lines.

2. Description of the Related Art

There is a conventional system for reading information in memory cells of an MROM (Mask Read Only Memory) using bit lines and virtual GND lines.

FIG. 6 is a conceptual view illustrating a configuration of a memory array 600 in a conventional MROM operating in such a system.

A memory array 600 shown in FIG. 6 includes a plurality of bit lines 601 and a plurality of virtual GND lines 602. A MOSFET 603 or a MOSFET 603A is connected between each pair of adjacent bit line 601 and virtual GND line 602. The MOSFETs 603 and 603A store binary information in the memory array 600 as described later and will be referred to as "memory cell transistors", hereinafter. In FIG. 6, the memory cell transistor 603 is a selected memory cell transistor, from which information is to be read. A word line 605 is provided perpendicular to the bit lines 601 and the virtual GND lines 602. The word line 605 is connected to a gate electrode 604 of each of the memory cell transistors 603 and 603A. A plurality of memory cell transistors 603 and 603A are connected to one word line 605, thus improving the space efficiency of the memory cell. The bit line 601 connected to the selected memory cell transistor 603 is connected to a charging circuit 1 and a sensing circuit 2, and the virtual GND line 602 connected to the selected memory cell transistor 603 is grounded. The charging circuit 1 is one exemplary device for charging the bit line 601.

The memory array 600 is produced so as to include the following two types of memory cell transistors. One type of memory cell transistors have a relatively high threshold level; i.e., are not turned ON when a certain voltage is applied by the word line 605 through the gate electrode 604 (OFF transistors). The other type of memory cell transistors have a relatively low threshold level; i.e., are turned ON when a certain voltage is applied by the word line 605 through the gate electrode 604 (ON transistors). Thus, binary information is stored in the memory array 600.

In the conventional memory array 600, the information is read in the following manner. The bit line 601 connected to the memory cell transistor 603 is charged by the charging circuit 1, and the virtual GND line 602 connected to the memory cell transistor 603 is grounded. In this potential state, the difference between the ON transistors and the OFF transistors is read by the sensing circuit 2. Thus, the information stored in the memory cell transistor 603 is determined to be ON or OFF.

One generally known system for reading information in such a memory array at a high speed is a hierarchical bit line system. A memory array operating in this system includes a main bit line, a sub bit line, and a bank transistor for connecting the main bit line and the sub bit line.

The main bit line mainly is formed of a metal layer, and a sub bit line mainly is formed of a diffusion layer. The diffusive layer acts as a source and a drain of each memory cell transistor. A group of memory cells respectively having gate electrodes connected to word lines WL1 through WLn in a bank transistor is referred to as a bank. In order to improve the space efficiency of the memory cell, one main bit line is connected to a plurality of sub bit lines through the bank transistor on a bank-by-bank basis. High speed reading is realized by accessing the memory cell through the main bit line on a bank-by-bank basis.

FIG. 7 is a configuration of a memory array circuit 700 of the hierarchical bit line system.

As shown in FIG. 7, the memory array circuit 700 includes a memory array 40, which includes a plurality of memory cell transistors arranged in an array. In more detail, the memory array 40 includes a plurality of word lines (e.g., word lines WL0 through WLn). Each word line (e.g., word line WL0) is connected to a gate of each memory cell transistor of a plurality of memory cell transistors (e.g., memory cell transistors M0 through M14). A plurality of bit lines and a plurality of virtual GND lines are provided perpendicular to the word lines. In FIG. 7, the main bit lines are indicated by MB0, MB2, MB4, MB6 and MB8; and the virtual GND lines are indicated by MB1, MB3, MB5 and MB7. Drains of the memory cell transistors connected to one word line are respectively connected to sources of the adjacent memory cell transistors. Accordingly, the memory cell transistors are connected in series. The sub bit lines are connected between a source of each memory cell transistor and a drain of an adjacent memory cell transistor.

The main bit line MB2 and the virtual GND line MB3 will be described, hereinafter. The main bit line MB2 is connected to sub bit lines SB2 and SB4. The sub bit line SB2 is connected to a drain of a memory cell transistor M1 and a source of the memory cell transistor M2 through a bank transistor BK1-2. The sub bit line SB4 is connected to a drain of a memory cell transistor M3 and a source of the memory cell transistor M4 through a bank transistor BK1-1. Since a gate of the bank transistor BK1-1 is connected to a bank selection line BKL2, the bank transistor BK1-1 is selected by the bank selection line BKL1. Since a gate of the bank transistor BK1-2 is connected to a bank selection line BKL2, the bank transistor BK1-2 is selected by the bank selection line BKL2. A drain of the memory cell transistor M2 and a source of the memory cell transistor N3 are connected to a sub bit line SB3.

The main bit line MB2 is connected to, for example, a block selection circuit 30, a charging and GND selection circuit 10 and a charging and sensing circuit 20. In more detail, a current from the main bit line MB2 is input to the charging and GND selection circuit 10 through a transistor TR1 of the block selection circuit 30. The current is then divided into two so as to be sent separately through transistors TR2 and TR3. The divided currents are input to the charging circuit 1 in the charging and sensing circuit 20. The current sent through the transistor TR3 in the charging and GND selection circuit 10 is detected by a sensing circuit 50 in the charging and sensing circuit 20. Gates of the transistors TR1, TR2 and TR3 are respectively connected to lines BLOCKSEL1, BSEL1 and BSEL2 and thus controlled.

A drain of the memory cell transistor M4 and a source of a memory cell transistor M5 are connected to a sub bit line SB5. The sub bit line SB5 is connected to a virtual GND line MB3 through a bank transistor BK3-2. A gate of the bank transistor BK3-2 is connected to a bank selection line BKL3. A current from the virtual GND line MB3 is input to the charging and GND selection circuit 10 through a transistor TR4 of the block selection circuit 30. The current is then divided into two so as to be sent separately through transistors TR5 and TR6. The current sent through the transistor TR5 is grounded in the charging and GND selection circuit 10. The current sent through the transistor TR6 is input to the charging circuit 1 in the charging and sensing circuit 20. Gates of the transistors TR4, TR5 and TR6 are respectively connected to lines BLOCKSEL1, VGSEL1 and VGSEL2 and thus controlled.

The configuration regarding the other main bit lines and virtual GND lines are substantially the same as the configuration regarding the main bit line MB2 and the virtual GND line MB3, and thus will not be described herein.

The charging and GND selection circuit 10 and the charging and sensing circuit 20 can be connected to a plurality of block selection circuits 30.

The memory array circuit 700 operates in the following manner for reading information from the memory cell transistor M4 (i.e., when the memory cell transistor M4 is selected).

The word line WL0 connected to the gate of the memory cell transistor M4 becomes HIGH (high level) and the other word lines WL1 through WLn become LOW (low level). In order to cause the bank transistors BK1-1 to be an ON transistor, the bank selection line BKL1 becomes HIGH. In order to cause the bank transistors BK3-2 to be an ON transistor, the bank selection line BKL3 becomes HIGH. The bank selection lines BKL2 and BKL4 become LOW.

Then, current paths of (MB2)-(BK1-1)-(SB4) and (SB5)-(BK3-2)-(MB3) are formed. In the case where the memory cell transistor M4 is an ON transistor, when the lines BSEL2, VGSEL1, BLOCKSEL1 become HIGH and the lines BSEL1 and VGSEL2 become LOW, the selected main bit line MB2 is made to be at the charging level and the selected virtual GND line MB3 is made to be at the GND level. Thus, the current flows in the path of (MB2)-(BK1-1)-(SB4)-(M4)-(SB5)-(BK3-2)-(MB3).

The sensing circuit 50 connected to the selected main bit line MB2 through the transistor TR1 determines that the memory cell transistor M4 is an ON transistor based on, for example, a change in the level of the selected main bit line MB2 from the charging level.

However, in the case where the selected memory cell transistor M4 is an OFF transistor and the non-selected memory cell transistors M3, M2, M1, M0 and the like in the vicinity of the memory cell transistor M4 are ON transistors, a current path of (M4)-(M3)-(M2)-(M1) . . . is formed although the memory cell transistor M4 is an OFF transistor. The reason is that the gates of the memory cell transistors M4, M3, M2, M1 and M0 are connected to the same word line WL0.

Accordingly, when the selected main bit line MB2 is made to be at the charging level, the current flows in the path of (MB2)-(BK1-1)-(SB4)-(M3)-(M2)-(M1) . . . . The current flowing in this path is referred to as a "bypass current" I1" (not shown). As a result, the selected memory cell transistor M4 behaves as an ON transistor though being an OFF transistor. In order to prevent such a behavior, the non-selected bit lines and the non-selected virtual GND lines are made to be at the charging level in the conventional circuit.

In the memory array circuit 700 shown in FIG. 7, the non-selected bit line MB0 and the non-selected virtual GND line MB1 are made to be at the charging level. As a result, the sub bit lines SB0 and SB1 are made to be at the charging level through respective bank transistors. In such a manner, even when the memory cell transistors M3, M2, M1, M0 and the like are ON transistors, the bypass current I1 is not generated. Therefore, the selected main bit line MB2 connected to the memory cell transistor M4 behaves differently when the memory cell transistor M4 is an OFF transistor from when the memory cell transistor M4 is an ON transistor. Thus, the information from the selected memory cell transistor M4 is read in a stable manner.

However, the above-mentioned system for preventing the bypass current I1 undesirably reduces the reading margin when the selected transistor is an ON transistor. In order to solve the problem, Japanese Laid-Open Publication No. 10-11991 proposes a specific system for connecting memory cell transistors and the bank transistors, as described below with reference to FIG. 9.

With reference to FIG. 7, the bypass current I1 will be described in more detail.

As described above, for reading information from the memory cell transistor M4, the selected main bit line MB2 is made to be at the charging level and the selected virtual GND line MB3 is made to be at the GND level. Also as described above, the non-selected main bit line MB0 and the non-selected virtual GND line MB1 are made to be at the charging level. The non-selected main bit line MB4 and the non-selected virtual GND line MB5 are also charged for the following reason.

In general, one cycle of reading operation reads information from a plurality of memory cell transistors simultaneously. In the memory array circuit 700, information in the memory cell transistor M12 is readable simultaneously with the information in the memory cell transistor M4. The non-selected main bit line MB4 and the non-selected virtual GND line MB5 are charged in order to prevent generation of a bypass current, which would otherwise be generated and flow from the sub bit line SB12 when information is read from the memory cell transistor M12.

Accordingly, when the memory cell transistors M5, M6, M7, M8 and the like in the vicinity of the memory cell transistor M4 are ON transistors, the non-selected bit line MB4 and the non-selected virtual GND line MB5 are made to be at the charging level. As a result, the sub bit lines SB4 and SB5 are made to be at the charging level through the respective bank transistors. Thus, a current path of (SB8)-(M7)-(M6)-(M5)-(M4)-(SB4) is formed. A current flowing in this path is referred to as a "bypass current I2". When the selected memory cell transistor M4 is an ON transistor, the bypass current I2 reduces the reading current flowing in the path of (MB2)-(BK1-1)-(SB4)-(M4)-(SB5)-(BK3-2)-(MB3). Such a reduction in the reading current decreases the reading speed of the information from the memory cell transistors and can undesirably cause a reading error of the information.

FIG. 8 shows a configuration of the memory array 40 including a plurality of memory cell transistors connected to one word line. When the non-selected bit line MB4 and non-selected virtual GND line MB5 are charged, the bypass current I2 is generated, which reduces the reading current for reading information from the memory cell transistor M4 when the memory cell transistor M4 is an ON transistor. However, the non-selected main bit line MB4 and the non-selected GND line MB5 indispensably need to be charged for reading information from the memory cell transistor M12 when the memory cell transistor M12 is an OFF transistor.

According to another possible solution for the problem of the bypass current, the number of the non-selected memory cell transistors between the memory cell transistors M4 and M12 is increased, and non-selected main bit lines 801 and non-selected virtual GND lines 802 are charged only to a minimum required level. In this manner, a current corresponding to the bypass current I2 flowing into the selected main bit line is reduced. However, this system does not fundamentally eliminate the current corresponding to the bypass current I2.

In the case where all the non-selected memory cell transistors between the memory cell transistors M4 and M12 are ON transistors, the charging of the non-selected main bit line MB4 and the non-selected GND line MB5, which is indispensable for reading the information from the memory cell transistor M12 when the memory cell transistor M12 is an OFF transistor, merely reduces the current corresponding to the bypass current I1 and does not fundamentally solve the problem of reducing the current for reading information from the memory cell transistor M4 when the memory cell transistor M4 is an ON transistor. The current corresponding to this bypass current I2 will be referred to as a "reading parasitic current", hereinafter.

A semiconductor memory device described in Japanese Laid-Open Publication No. 10-11991 will be described with reference to FIG. 9. FIG. 9 is a circuit configuration of a semiconductor memory device 300.

In the semiconductor memory device 300, bank transistors connected to the main bit lines BS0 through BS3 and bank transistors connected to the main bit lines BS4 through BS7 are connected to bank selection lines BKL1 through BKL4 in different manners. When the memory cell transistor M4 is selected, the main bit line BS4 and the virtual GND line BS3 are selected. Since the non-selected main bit line BS1 is at the charging level at this point, the current flows to the selected virtual GND line BS3 through the non-selected memory cell transistors M2 and M3. However, since there are only two non-selected memory cell transistors M2 and M3 through which the current flows to the selected virtual GND line BS3, the reading parasitic current can be reduced.

The semiconductor memory device 300 does not solve the problem that the reading parasitic current is generated although reducing the amount thereof.

SUMMARY OF THE INVENTION

According to one aspect of the invention, a semiconductor memory device includes a plurality of bit lines; a plurality of virtual GND lines; and a plurality of memory cell transistors arranged in an array. The plurality of bit lines includes a selected bit line directly connected to a memory cell transistor to be read among the plurality of memory cell transistors and a non-selected bit line. The plurality of virtual GND lines includes a selected virtual GND line directly connected to the memory cell transistor to be read and a non-selected virtual GND line. The non-selected bit lines include a charge non-selected bit line to be charged and a non-selected dummy bit line to be grounded. The non-selected virtual GND lines include a charge non-selected virtual GND line to be charged. The non-selected dummy bit line is connected between the selected virtual GND line and one of the charge non-selected bit line and the charge non-selected virtual GND line.

In one embodiment of the invention, the semiconductor memory device further includes a plurality of word lines provided perpendicular to the plurality of bit lines.

In one embodiment of the invention, a part of at least one word line of the plurality of word lines is connected to a gate of at least one memory cell transistor of the plurality of memory cell transistors.

In one embodiment of the invention, a part of at least one virtual GND line of the plurality of virtual GND lines is connected to a source of at least one memory cell transistor of the plurality of memory cell transistors, and a part of at least one virtual GND line of the plurality of virtual GND lines is connected to a drain of at least one memory cell transistor of the plurality of memory cell transistors, the at least one virtual GND line of the plurality of virtual GND lines connected to the source being different from the at least one virtual GND line of the plurality of virtual GND lines connected to the drain.

In one embodiment of the invention, the selected virtual GND line and the non-selected dummy bit line are grounded through different grounding devices.

In one embodiment of the invention, at least one of the non-selected bit line and the non-selected virtual GND line and connected between the selected virtual GND line and the non-selected dummy bit line and are in a floating state for reading information from the memory cell transistor to be read.

In one embodiment of the invention, the semiconductor memory device is a read-only memory.

According to another aspect of the invention, the semiconductor memory device includes a plurality of bit lines; a plurality of virtual GND lines; and a plurality of memory cell transistors arranged in an array. The plurality of bit lines includes a selected bit line directly connected to a memory cell transistor to be read among the plurality of memory cell transistors and a non-selected bit line. The plurality of virtual GND lines includes a selected virtual GND line directly connected to the memory cell transistor to be read and a non-selected virtual GND line. The non-selected bit lines include a charge non-selected bit line to be charged. The non-selected virtual GND lines include a charge non-selected virtual GND line to be charged and a non-selected dummy virtual GND line to be grounded. The non-selected dummy virtual GND line is connected between the selected virtual GND line and one of the charge non-selected bit line and the charge non-selected virtual GND line.

In one embodiment of the invention, the semiconductor memory device further includes a plurality of word lines provided perpendicular to the plurality of bit lines.

In one embodiment of the invention, a part of at least one word line of the plurality of word lines is connected to a gate of at least one memory cell transistor of the plurality of memory cell transistors.

In one embodiment of the invention, a part of at least one virtual GND line of the plurality of virtual GND lines is connected to a source of at least one memory cell transistor of the plurality of memory cell transistors, and a part of at least one virtual GND line of the plurality of virtual GND lines is connected to a drain of at least one memory cell transistor of the plurality of memory cell transistors, the at least one virtual GND line of the plurality of virtual GND lines connected to the source being different from the at least one virtual GND line of the plurality of virtual GND lines connected to the drain.

In one embodiment of the invention, the selected virtual GND line and the non-selected dummy virtual GND line are grounded through different grounding devices.

In one embodiment of the invention, the non-selected bit line and the non-selected virtual GND line are connected between the selected virtual GND line and the non-selected dummy virtual GND line and are in a floating state for reading information from the memory cell transistor to be read.

In one embodiment of the invention, the semiconductor memory device is a read-only memory.

According to the present invention, the reading parasitic current is substantially eliminated. Therefore, the amount of the current for reading the selected main bit line is increased to improve the stability and speed of reading information from a memory cell. Since the amount of the current for reading the selected bit line is increased, the number of banks connected to the main bit line can be increased. This allows the number of word lines to be reduced and thus allows the number of word lines to be decreased and the chip to be more compact.

Thus, the invention described herein makes possible the advantage of providing a semiconductor memory device for substantially eliminating a reading parasitic current flowing to a selected bit line instead of merely reducing the amount of the reading parasitic current.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

A semiconductor memory device 100 in a first example according to the present invention will be described with reference to FIGS. 1 and 2. In this example, the semiconductor memory device 100 is a read-only memory.

Figure 1:
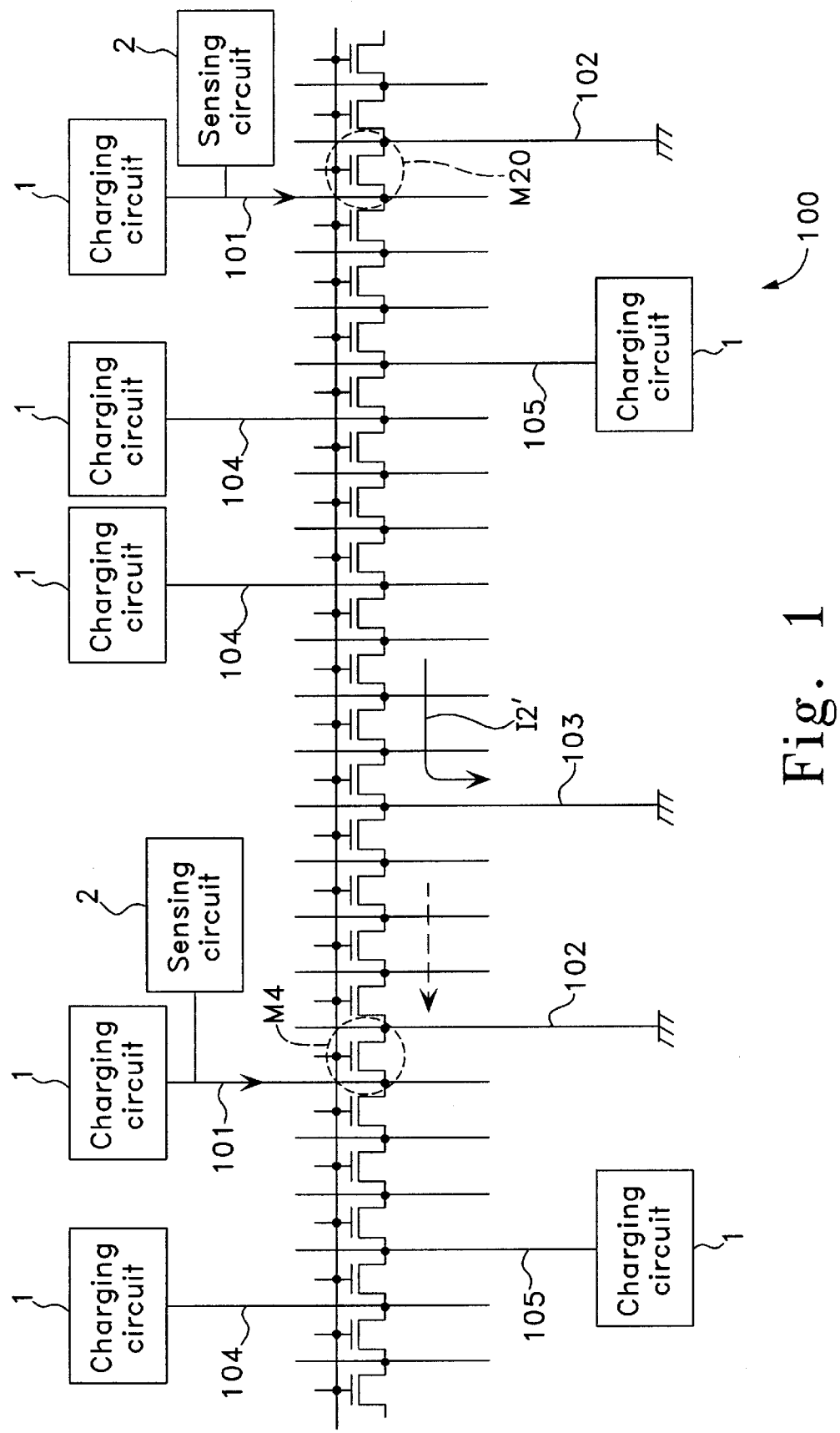
FIG. 1 is a conceptual view of a semiconductor memory device in a first example according to the present invention, illustrating the state in which a reading parasitic current is prevented from flowing to a selected memory cell transistor.
Figure 2:
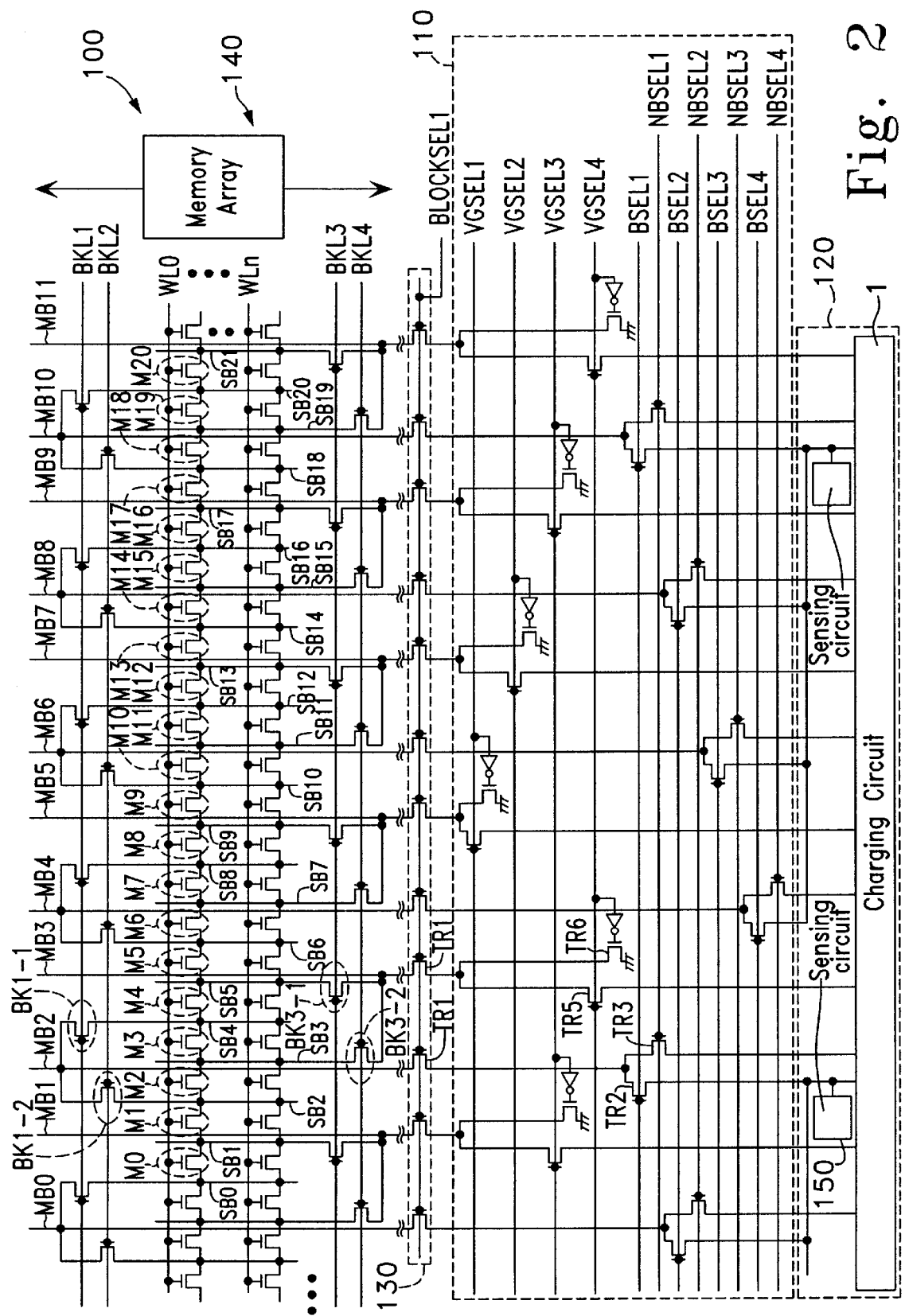
FIG. 2 is a circuit configuration of the semiconductor memory device shown in FIG. 1.

FIG. 1 is a conceptual view of the semiconductor memory device 100, and FIG. 2 is a circuit configuration of the semiconductor memory device 100. FIG. 1 illustrates the state in which a reading parasitic current I2' flows to a non-selected dummy virtual GND line 103 (indicated by solid arrow), and as a result, the reading parasitic current I2' does not flow to a selected bit line 101 or a selected virtual GND line 102 (indicated by dashed arrow).

As shown in FIG. 2, the semiconductor memory device 100 includes a memory array 140, a block selection circuit 130, a charging and GND selection circuit 110, a charging and sensing circuit 120. The charging and GND selection circuit 110 and a charging and sensing circuit 120 can be connected to a plurality of block selection circuits 130. The bank structure of the memory array 140 is the same as the bank structure of the memory array 40 of the memory array circuit 700 shown in FIG. 7.

Figure 7:
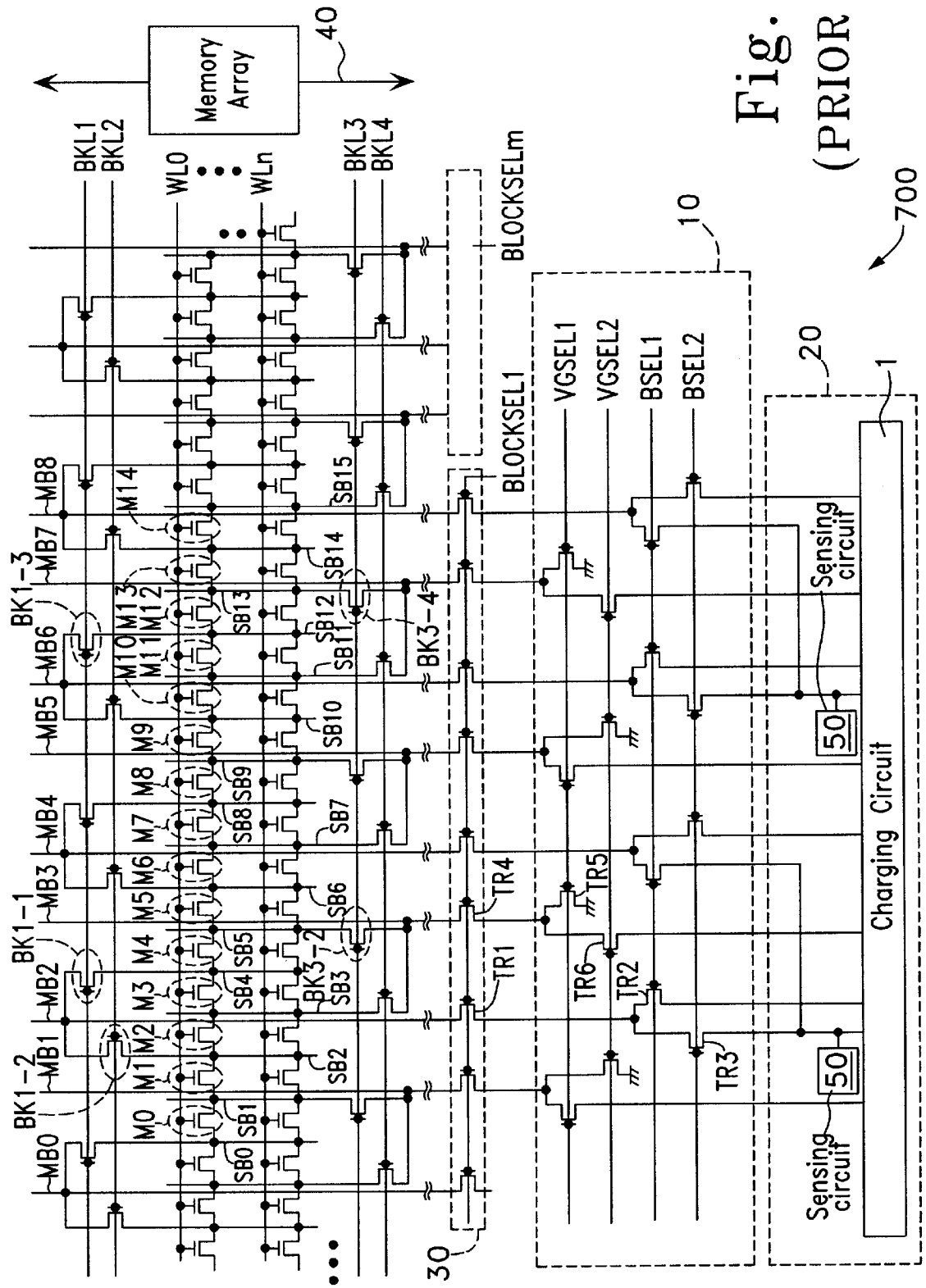
FIG. 7 is a circuit configuration of a conventional memory array circuit of a hierarchical system.
Figure 8:
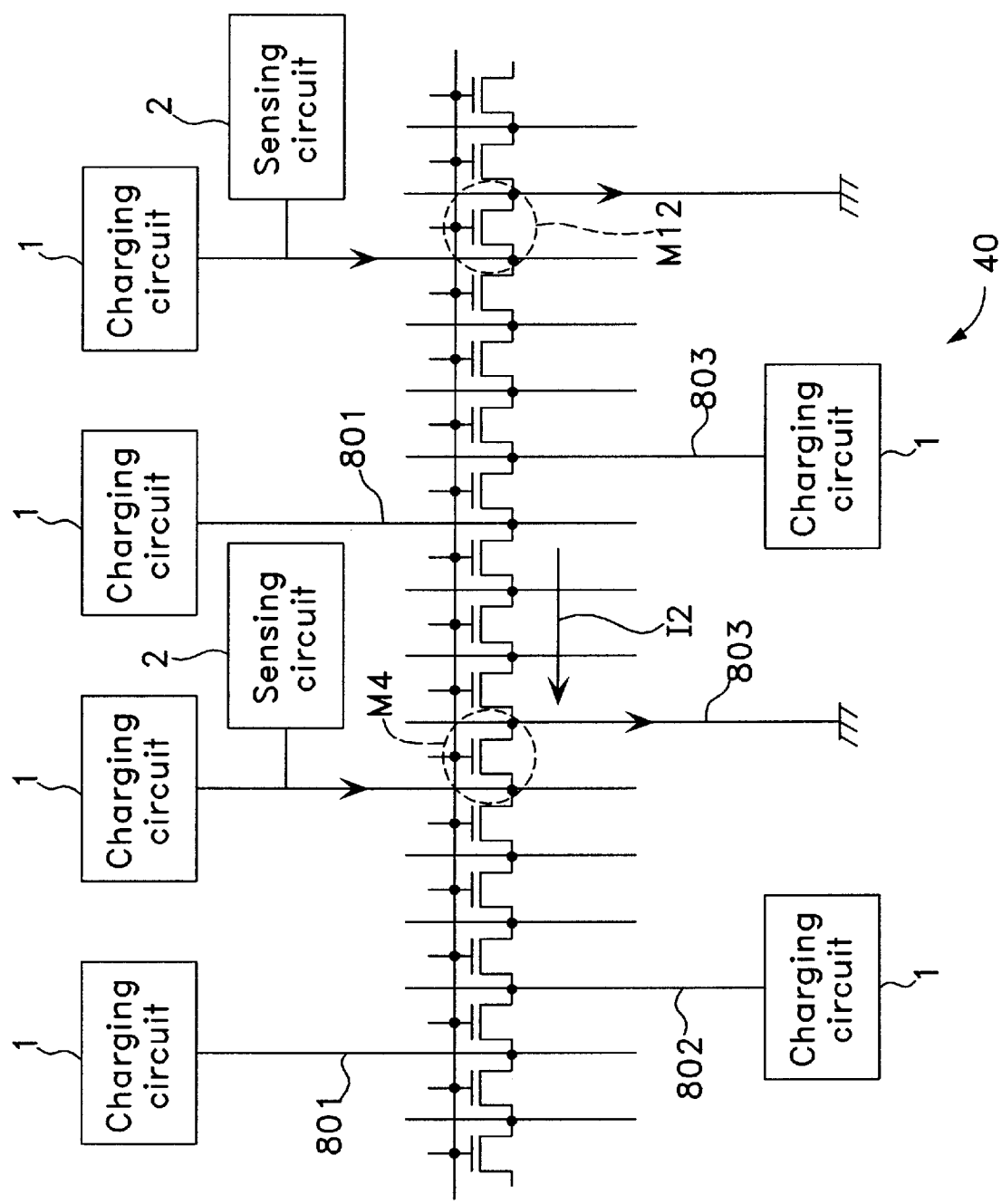
FIG. 8 is a configuration of a memory array of the memory array circuit shown in FIG. 7, in which a non-selected bit line and a non-selected virtual GND line are charged.
Figure 9:
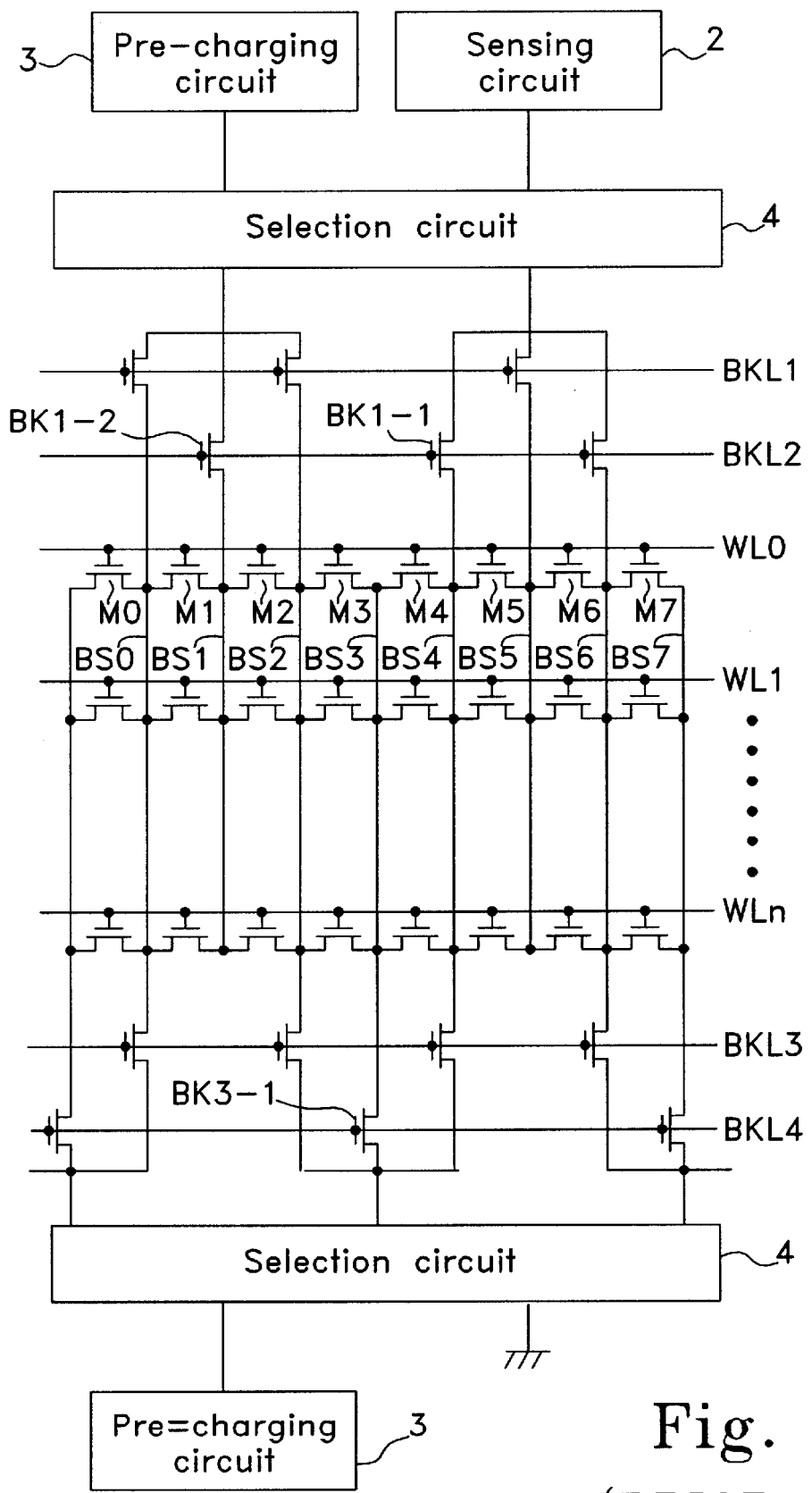
FIG. 9 is a circuit configuration of a conventional semiconductor memory device.

The charging and GND selection circuit 110 operates in a different manner from the charging and GND selection circuit 10 shown in FIG. 7. Specifically, the charging and GND selection circuit 110 controls the bit lines and the virtual GND lines of the memory array 140.

The semiconductor memory device 100 shown in FIG. 2 has the same basic structure as that of the memory array circuit 700 shown in FIG. 7.

As shown in FIG. 2, the memory array 140 includes a plurality of memory cell transistors arranged in an array. In more detail, the memory array 140 includes a plurality of word lines (e.g., word lines WL0 through WLn). Each word line (e.g., word line WL0) is connected to a gate of each memory cell transistor of a plurality of memory cell transistors (e.g., memory cell transistors M0 through M20). A plurality of bit lines and a plurality of virtual GND lines are provided perpendicular to the word lines. In FIG. 2, the main bit lines are indicated by MB0, MB2, MB4, MB6, MB8 and MB10; and the virtual GND lines are indicated by MB1, MB3, MB5, MB7, MB9 and MB11. Drains of the memory cell transistors connected to one word line are respectively connected to sources of the adjacent memory cell transistors. Accordingly, the memory cell transistors are connected in series. The sub bit lines are connected between a source of each memory cell transistor and a drain of an adjacent memory cell transistor.

The main bit line MB2 and the virtual GND line MB3 will be described, hereinafter. The main bit line MB2 is connected to sub bit lines SB2 and SB4. The sub bit line SB2 is connected to a drain of a memory cell transistor M1 and a source of the memory cell transistor M2 through a bank transistor BK1-2. The sub bit line SB4 is connected to a drain of a memory cell transistor M3 and a source of the memory cell transistor M4 through a bank transistor BK1-1. Since a gate of the bank transistor BK1-1 is connected to a bank selection line BKL1, the bank transistor BK1-1 is selected by the bank selection line BKL1. Since a gate of the bank transistor BK1-2 is connected to a bank selection line BKL2, the bank transistor BK1-2 is selected by the bank selection line BKL2. A drain of the memory cell transistor M2 and a source of the memory cell transistor M3 are connected to a sub bit line SB3.

The main bit line MB2 is connected to, for example, the block selection circuit 130, the charging and GND selection circuit 110 and the charging and sensing circuit 120. In more detail, a current from the main bit line MB2 is input to the charging and GND selection circuit 110 through a transistor TR1 of the block selection circuit 130. The current is then divided into two so as to be sent separately through transistors TR2 and TR3. The divided currents are input to the charging circuit 1 in the charging and sensing circuit 120. The current sent through the transistor TR3 in the charging and GND selection circuit 110 is detected by a sensing circuit 150 in the charging and sensing circuit 120. Gates of the transistors TR1, TR2 and TR3 are respectively connected to lines BLOCKSEL1, BSEL1 and NBSEL1 and thus controlled.

A drain of the memory cell transistor M4 and a source of a memory cell transistor M5 are connected to a sub bit line SB5. The sub bit line SB5 is connected to a virtual GND line MB3 through a bank transistor BK3-1. A gate of the bank transistor BK3-1 is connected to a bank selection line BKL3. A current from the virtual GND line MB3 is input to the charging and GND selection circuit 110 through a transistor TR4 of the block selection circuit 130. The current is then divided into two so as to be sent separately through transistors TR5 and TR6. The current sent through the transistor TR6 is grounded in the charging and GND selection circuit 110. The current sent through the transistor TR5 is input to the charging circuit 1 in the charging and sensing circuit 120. Gates of the transistors TR4, TR5 and TR6 are respectively connected to lines BLOCKSEL1, VGSEL4 and VGSEL4 and thus controlled.

The configuration regarding the other main bit lines and virtual GND lines are substantially the same as the configuration regarding the main bit line MB2 and the virtual GND line MB3, and thus will not be described herein.

The semiconductor memory device 100 operates in the following manner for reading information from the memory cell transistor M4. Herein, the memory cell transistor M4 is selected, and information in the memory cell transistor M20 is readable simultaneously with the information in memory cell transistor M4.

The word line WL0 connected to the gate of the memory cell transistor M4 becomes HIGH and the other word lines WL1 through WLn become LOW. In order to make the bank transistor BK1-1 an ON transistor, the bank selection line BKL1 becomes HIGH. In order to make the bank transistor BK3-1 an ON transistor, the bank selection line BKL3 becomes HIGH. The bank selection lines BKL2 and BKL4 become LOW.

Then, current paths of (MB2)-(BK1-1)-(SB4) and (SB5)-(BK3-1)-(MB3) are formed. In the case where the memory cell transistor M4 is an ON transistor, the lines behave as follows. The line BLOCKSEL1 becomes HIGH. In the charging and GND selection circuit 110, the lines VGSEL1 and VGSEL4 become LOW, the lines VGSEL2 and VGSEL3 become HIGH, the lines NBSEL1, BSEL2, BSEL3, NBSEL3, BSEL4 and NBSEL4 become LOW, and the lines BSEL1 and NBSEL2 become HIGH. At this point, the main bit lines MB0, MB1, MB2, MB7, MB8, MB9 and MB10 are made to be at the charging level, the main bit lines MB2 and MB10 are connected to the sensing circuit 150, the main bit lines MB3, MB5 and MB11 are made to be at the GND level, and the main bit lines MB4 and MB6 are made to be in a floating state. Thus, the current flows in the path of (MB2)-(BK1-1)-(SB4)(M4)-(SB5)-(BK3-2)-(MB3).

Figure 3:
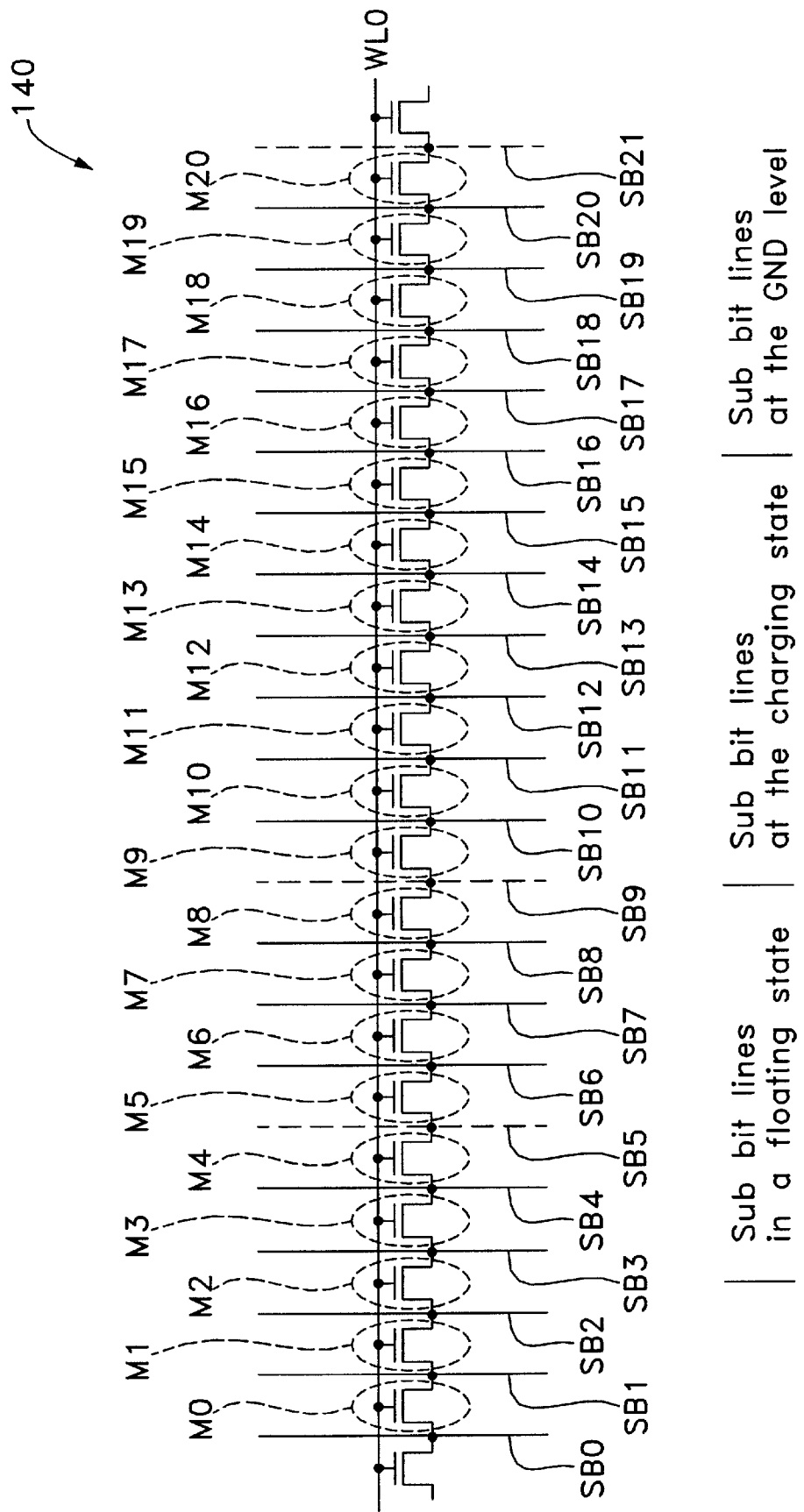
FIG. 3 is a circuit configuration of the semiconductor memory device shown in FIG. 1, illustrating the state of sub bit lines when the reading parasitic current is prevented from flowing to the selected memory cell transistor.

The state of the sub bit lines at this point is shown in FIG. 3. FIG. 3 illustrates a configuration of memory cell transistors M0 through M20 connected to the word line WL0.

The memory cell transistor M4 is selected. The non-selected dummy virtual GND line for the memory cell transistor M4 is SB9. The sub bit lines SB13, SB16 and SB17 are charged in order to prevent a current corresponding to the bypass current I1 described with reference to FIG. 7. Without the charging, the bypass current I1 would be generated when the memory cell transistor M20, from which information is readable simultaneously with the information in the memory cell transistor M4, is an OFF transistor.

The charging of the sub bit lines SB13, SB16 and SB17 generates a reading parasitic current which flows to the memory cell transistor M4 in a conventional device. In this example, however, the reading parasitic current flows to the non-selected dummy GND line SB9 and thus does not flow to the memory cell transistor M4.

In FIG. 3, three sub bit lines SB13, SB16 and SB17 are charged. The number of the sub bit lines charged can be one or two as long as the current corresponding to the bypass current I2 is prevented. In that case, the charging and GND selection circuit 110 and the like need to be changed in structure. The charging and GND selection circuit 110, the charging and sensing circuit 120 and the like can be replaced with different types of circuits which can provide a function corresponding to that of the non-selected dummy virtual GND line or a non-selected dummy bit line.

In this example, as shown in FIG. 2, the selected virtual GND line SB5 is electrically connected to the main bit line MB3 at the GND level, and the non-selected dummy virtual GND line SB9 is electrically connected to the main bit line MB5 at the GND level. Since the selected virtual GND line SB5 and the non-selected dummy virtual GND line SB9 are made to be at the GND level by different paths, the reading parasitic current I2' flows only to the non-selected dummy virtual GND line SB9 and does not flow to the selected virtual GND line SB5 as shown in FIG. 1.

In this example, for reading information from a memory cell transistor, a non-selected virtual GND line or a non-selected virtual bit line needs to be provided between the selected virtual GND line (e.g., SB5) and the non-selected dummy virtual GND line (e.g., SB9), and the non-selected virtual GND line and the non-selected virtual bit line all need to be in a floating state for the following reason.

Although the selected virtual GND line SB5 and the non-selected dummy virtual GND line SB9 are made to be at the GND level by different paths, a reading parasitic current is generated when there is a charged non-selected virtual GND line or a charged non-selected virtual GND line between the selected virtual GND line SB5 and the non-selected dummy virtual GND line SB9. In FIG. 2, the bit lines SB6, SB7 and SB8 are in a floating state between the selected virtual GND line SB5 and the non-selected dummy virtual GND line SB9.

EXAMPLE 2

A semiconductor memory device 200 in a second example according to the present invention will be described with reference to FIGS. 4 and 5.

Figure 4:
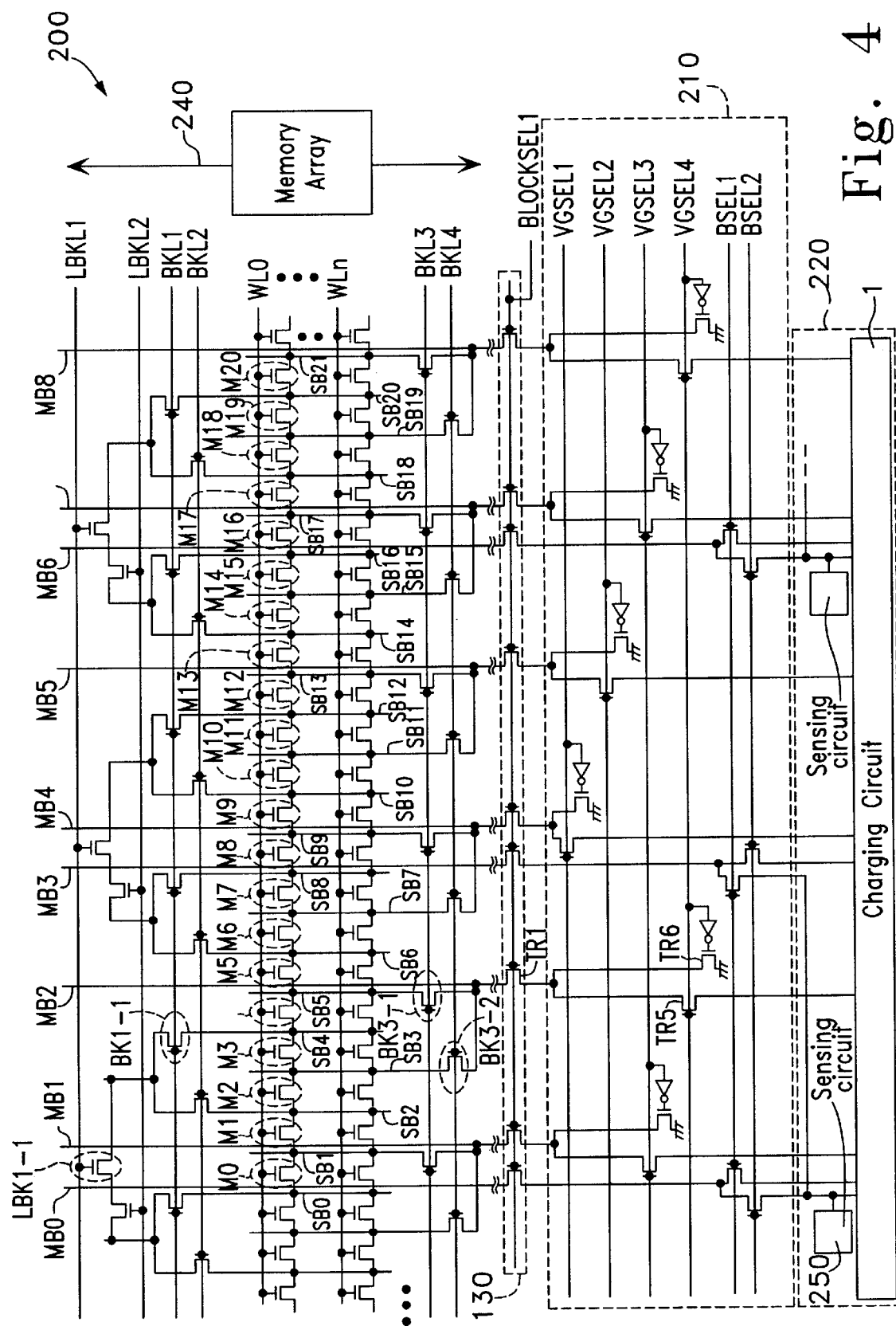
FIG. 4 is a circuit configuration of a semiconductor memory device in a second example according to the present invention.

FIG. 4 is a circuit configuration of the semiconductor memory device 200.

The semiconductor memory device 200 includes a memory array 240. The memory array 240 includes bank transistors (e.g., LBK1-1) in addition to the elements included in the memory array 140 shown in FIG. 2. Accordingly, the memory array 240 includes a smaller number of main bit lines than the memory array 140.

The main bit lines and the sub bit lines connected to the main bit lines are connected to the bank transistors (e.g., LBK1-1 and BK1-1), and the virtual GND lines and the sub bit lines connected to the virtual GND lines are connected to the bank transistors (e.g., BK3-1).

Except for the above-described points, the semiconductor memory device 200 has substantially the same structure as the semiconductor memory device 100 shown in FIG. 2.

The semiconductor memory device 200 operates in the following manner for reading information from the memory cell transistor M4. Information in the memory cell transistor M20 is readable simultaneously with the information in memory cell transistor M4.

The word line WL0 connected to the gate of the memory cell transistor M4 becomes HIGH and the other word lines WL1 through WLn become LOW. In order to make the bank transistors LBK1-1, BK1-1 and BK3-1 ON transistors, a line LBKL1 and the bank selection lines BKL1 and BKL3 become HIGH. A line LBKL2 and the bank selection lines BKL2 and BKL4 become LOW.

Then, a current path of (MB0)-(LBK1-1)-(BK-1)-(SB4) and (SB5)-(BK3-1)-(MB2) are formed. In the case where the memory cell transistor M4 is an ON transistor, the lines behave as follows. The line BLOCKSEL1 in a block selection circuit 230 becomes HIGH. In a charging and GND selection circuit 210, the lines VGSEL1 and VGSEL4 become LOW, the lines VGSEL2 and VGSEL3 become HIGH, the line BSEL1 becomes LOW, and the line BSEL2 becomes HIGH. At this point, the main bit lines MB0, MB1, MB3, MB5, MB6 and MB7 are made to be at the charging level, the main bit lines MB0 and MB6 are connected to a sensing circuit 250, and the main bit lines MB2, MB4 and MB8 are made to be at the GND level. Thus, the current flows in the path of (MB0)-(LBK1-1)-(BK1-1)-(SB4)-(M4)-(SB5)-(BK3-1)-(MB2).

Figure 5:
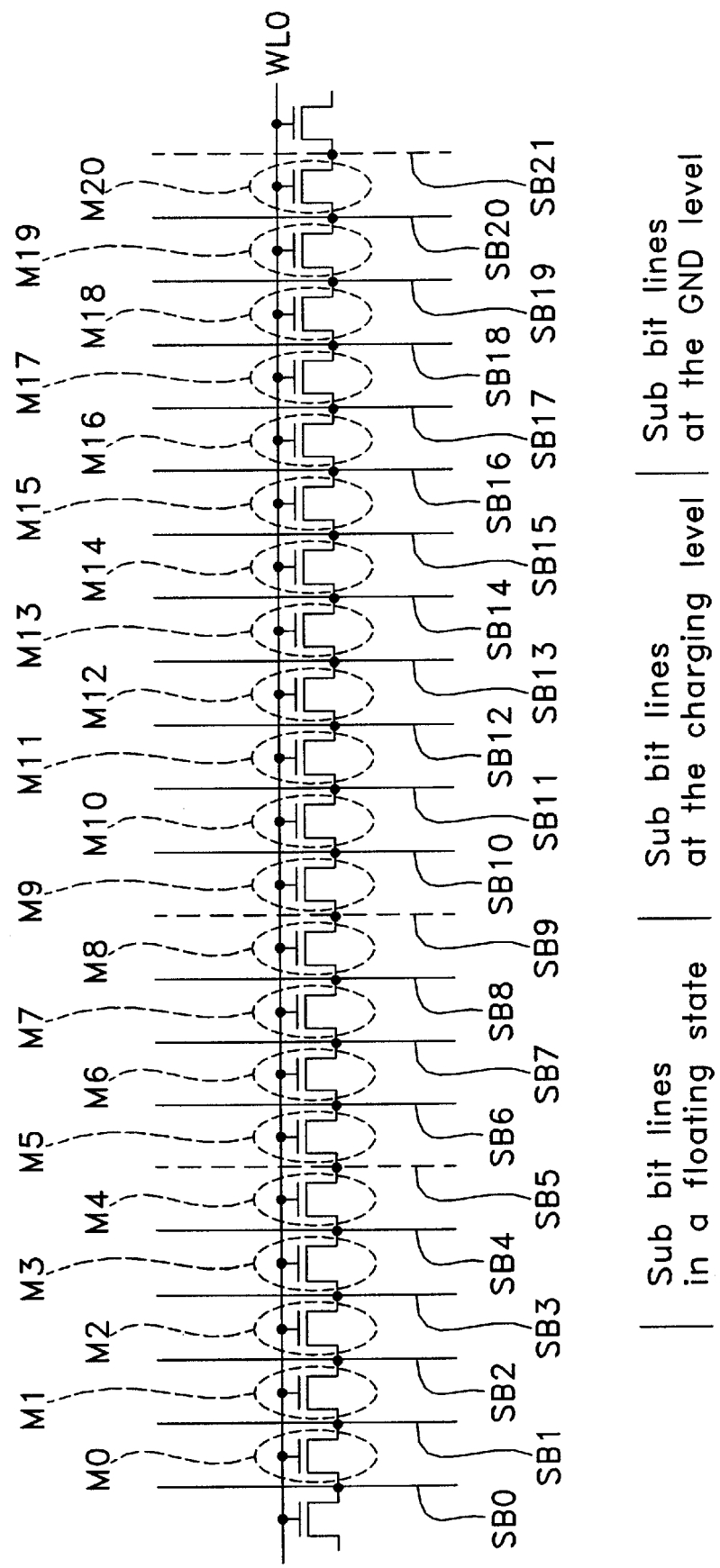
FIG. 5 is a circuit configuration of the semiconductor memory device shown in FIG. 4, illustrating the state of sub bit lines when a reading parasitic current is prevented from flowing to a selected memory cell transistor.
Figure 6:
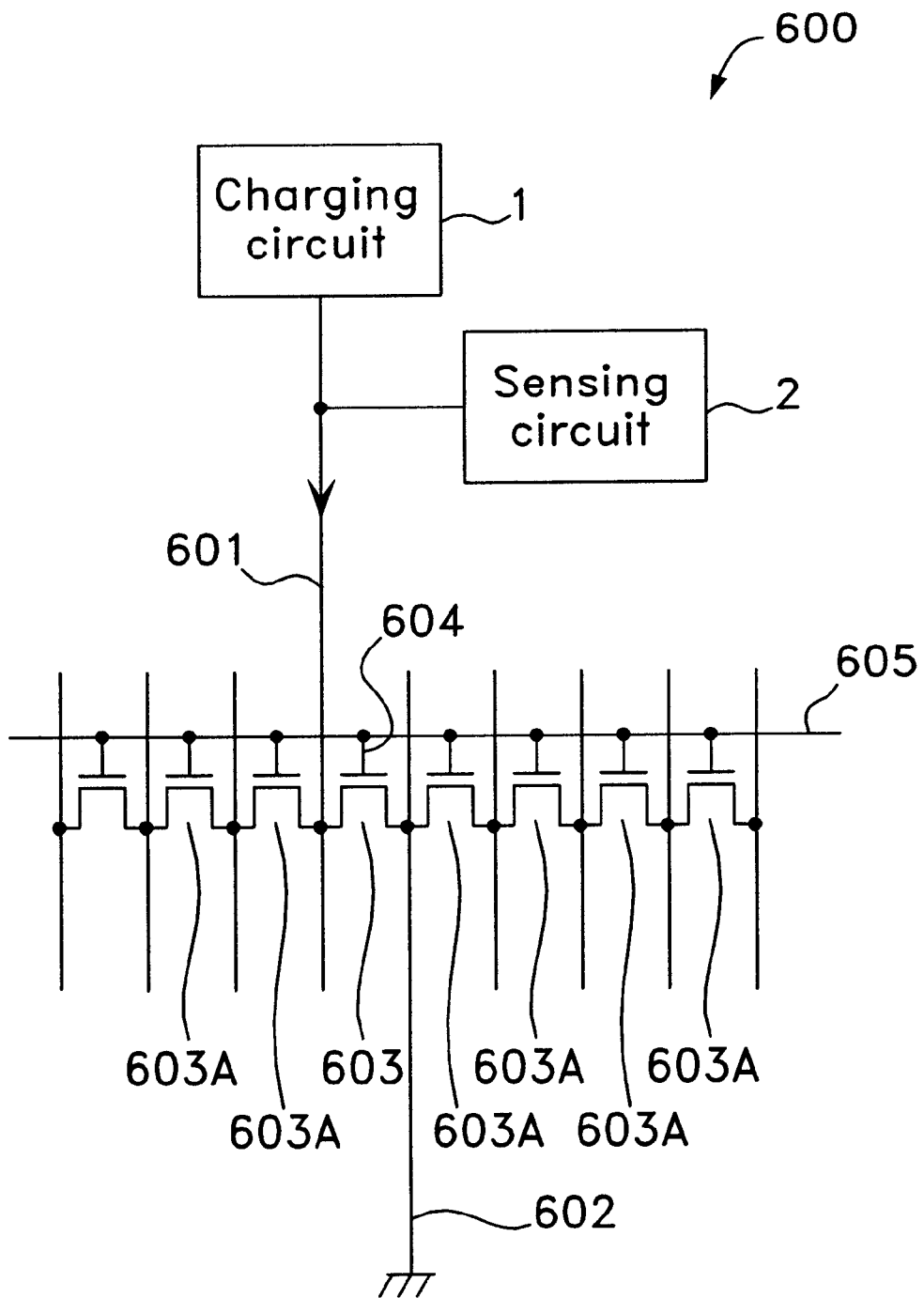
FIG. 6 is a conceptual view of a conventional MROM.

The state of the sub bit lines at this point is shown in FIG. 5. FIG. 5 illustrates a configuration of memory cell transistors M0 through M20 connected to the word line WL0.

The memory cell transistor M4 is selected. The non-selected dummy virtual GND line for the memory cell transistor M4 is SB9.

In the first and second examples, a non-selected dummy GND line is used to prevent the reading parasitic current from flowing to the selected memory cell transistor. A non-selected dummy bit line is usable instead of the non-selected dummy GND line as briefly mentioned above. Different bank structures and different hierarchical bit line systems are also applicable to the present invention.

As described above, according to the present invention, a reading parasitic current is prevented from flowing to a current for reading information from a selected memory cell transistor. Thus, the amount of the current for reading the selected bit line is increased, resulting in improvement in the stability and speed of reading the information from the memory cell.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a plurality of bit lines;
   a plurality of virtual GND lines; and
   a plurality of memory cell transistors arranged in an array, wherein:
      the plurality of bit lines includes a selected bit line directly connected to a memory cell transistor to be read among the plurality of memory cell transistors and a plurality of non-selected bit lines,
      the plurality of virtual GND lines includes a selected virtual GND line directly connected to the memory cell transistor to be read and a plurality of non-selected virtual GND lines,
      the plurality of non-selected bit lines include a charge non-selected bit line to be charged and a non-selected dummy bit line to be grounded,
      the plurality of non-selected virtual GND lines include a charge non-selected virtual GND line to be charged, and
      the grounded non-selected dummy bit line is connected between the selected virtual GND line and one of the charged charge non-selected bit lines and the charged charge non-selected virtual GND line.

2. The semiconductor memory device according to claim 1, further comprising a plurality of word lines provided perpendicular to the plurality of bit lines.

3. The semiconductor memory device according to claim 2, wherein a part of at least one word line of the plurality of word lines is connected to a gate of at least one memory cell transistor of the plurality of memory cell transistors.

4. The semiconductor memory device according to claim 1, wherein a part of at least one virtual GND line of the plurality of virtual GND lines is connected to a source of at least one memory cell transistor of the plurality of memory cell transistors, and a part of at least one virtual GND line of the plurality of virtual GND lines is connected to a drain of at least one memory cell transistor of the plurality of memory cell transistors, the at least one virtual GND line of the plurality of virtual GND lines connected to the source being different from the at least one virtual GND line of the plurality of virtual GND lines connected to the drain.

5. The semiconductor memory device according to claim 1, wherein the selected virtual GND line and the non-selected dummy bit line are grounded through different grounding devices.

6. The semiconductor memory device according to claim 1, wherein at least one of the plurality of non-selected bit lines and at least one of the plurality of non-selected virtual GND lines are connected between the selected virtual GND line and the non-selected dummy bit line and are in a floating state for reading information from the memory cell transistor to be read.

7. The semiconductor memory device according to claim 1, which is a read-only memory.

8. A semiconductor memory device, comprising:
   a plurality of bit lines;
   a plurality of virtual GND lines; and
   a plurality of memory cell transistors arranged in an array, wherein:
      the plurality of bit lines includes a selected bit line directly connected to a memory cell transistor to be read among the plurality of memory cell transistors and a non-selected bit line,
      the plurality of virtual GND lines includes a selected virtual GND line directly connected to the memory cell transistor to be read and a non-selected virtual GND line,
      the non-selected bit lines include a charge non-selected bit line to be charged,
      the non-selected virtual GND lines include a charge non-selected virtual GND line to be charged and a non-selected dummy virtual GND line to be grounded, and
      the non-selected dummy virtual GND line is connected between the selected virtual GND line and both of the charged charge non-selected bit line and the charged charge non-selected virtual GND line.

9. The semiconductor memory device according to claim 8, further comprising a plurality of word lines provided perpendicular to the plurality of bit lines.

10. The semiconductor memory device according to claim 9, wherein a part of at least one word line of the plurality of word lines is connected to a gate of at least one memory cell transistor of the plurality of memory cell transistors.

11. The semiconductor memory device according to claim 8, wherein a part of at least one virtual GND line of the plurality of virtual GND lines is connected to a source of at least one memory cell transistor of the plurality of memory cell transistors, and a part of at least one virtual GND line of the plurality of virtual GND lines is connected to a drain of at least one memory cell transistor of the plurality of memory cell transistors, the at least one virtual GND line of the plurality of virtual GND lines connected to the source being different from the at least one virtual GND line of the plurality of virtual GND lines connected to the drain.

12. The semiconductor memory device according to claim 8, wherein the selected virtual GND line and the non-selected dummy virtual GND line are grounded through different grounding devices.

13. The semiconductor memory device according to claim 8, wherein at least one of the plurality of non-selected bit lines and at least one of the plurality of non-selected virtual GND lines are connected between the selected virtual GND line and the non-selected dummy virtual GND line and are in a floating state for reading information from the memory cell transistor to be read.

14. The semiconductor memory device according to claim 8, which is a read-only memory.

* * * * *